(12) United States Patent
Coates et al.

(10) Patent No.: US 6,600,325 B2
(45) Date of Patent: Jul. 29, 2003

(54) METHOD AND APPARATUS FOR PROBING AN INTEGRATED CIRCUIT THROUGH CAPACITIVE COUPLING

(75) Inventors: William S. Coates, Los Altos, CA (US); Robert J. Bosnyak, San Jose, CA (US); Ivan E. Sutherland, Santa Monica, CA (US)

(73) Assignee: Sun Microsystems, Inc., Santa Clara, CA (US)

( * ) Notice: Subject to any disclaimer, the term of this patent is extended or adjusted under 35 U.S.C. 154(b) by 47 days.

(21) Appl. No.: 09/778,622

(22) Filed: Feb. 6, 2001

(65) Prior Publication Data

US 2002/0105337 A1 Aug. 8, 2002

(51) Int. Cl.$^7$ .................. G01R 31/08; G01R 31/02; G01R 27/26; H01H 31/02
(52) U.S. Cl. .................. 324/519; 324/686; 324/690; 324/758; 324/555
(58) Field of Search ................... 324/519, 513, 324/758, 555, 665, 686, 690

(56) References Cited

U.S. PATENT DOCUMENTS

| | | | | |
|---|---|---|---|---|
| 4,392,378 A | * | 7/1983 | Pitches et al. .............. 307/118 |
| 5,124,660 A | * | 6/1992 | Cilingiroglu ................ 324/538 |
| 5,157,325 A | * | 10/1992 | Murphy ...................... 324/72.5 |
| 5,274,336 A | * | 12/1993 | Crook et al. ................ 324/149 |
| 5,469,064 A | * | 11/1995 | Kerschner et al. .......... 324/537 |
| 5,629,838 A | * | 5/1997 | Knight et al. ............... 361/734 |

* cited by examiner

Primary Examiner—N. Le
Assistant Examiner—John Teresinski
(74) Attorney, Agent, or Firm—Park, Vaughan & Fleming LLP

(57) ABSTRACT

One embodiment of the present invention provides a system for capacitively probing electrical signals within an integrated circuit. This system operates by placing a probe conductor in close proximity to, but not touching, a target conductor within the integrated circuit. In this position, the probe conductor and the target conductor form a capacitor that stores a charge between the probe conductor and the target conductor. Next, the system detects a change in a probe voltage on the probe conductor caused by a change in a target voltage on the target conductor, and then determines a logic value for the target conductor based on the change in the probe voltage. In one embodiment of the present invention, determining the logic value for the target conductor involves, determining a first value if the probe voltage decreases, and determining a second value if the probe voltage increases.

21 Claims, 6 Drawing Sheets

METHOD AND APPARATUS FOR PROBING AN INTEGRATED CIRCUIT THROUGH CAPACITIVE COUPLING

BACKGROUND

1. Field of the Invention

The present invention relates to the testing of integrated circuits. More specifically, the present invention relates to a method and an apparatus for probing electrical signals within an integrated circuit using a capacitive mechanism that requires no physical contact with the integrated circuit.

2. Related Art

Advances in semiconductor technology presently make it possible to integrate large-scale systems, including tens of millions of transistors, into a single semiconductor chip. Integrating such large-scale systems into a single semiconductor chip increases the speed at which such systems can operate, because signals between system components do not have to cross chip boundaries, and are not subject to lengthy chip-to-chip propagation delays. Moreover, integrating large-scale systems onto a single semiconductor chip significantly reduces production costs, because fewer semiconductor chips are required to perform a given computational task.

Unfortunately, integrating a large-scale system onto a single semiconductor chip can greatly complicate the task of testing. This testing is presently performed in a number of ways. An automated system of probing can be performed by using a probe card and a test system. This probe card makes electrical contact to the pads normally used to communicate to the chip. After a wafer is cut into individual die and assembled, it can be tested again using similar techniques.

Note that probe points are typically very large in comparison to feature size. Moreover, probing is normally limited to only the pins that will be the external inputs and outputs of the final semiconductor chip. Furthermore, additional probe pads can be added to monitor other critical signals to help determine which die are functional. Unfortunately, these extra probe points consume valuable chip area because they must follow the same tolerance/size area of normal pads.

Furthermore, many important signals are weak and therefore must be amplified to drive the probe pads. This amplification process requires additional circuitry and introduces additional delay.

Functional testing can also be performed using built-in scan-path structures at the same time wafer probing is taking place or after a die is packaged into a chip. However, scan-path testing can be prohibitively slow because of the large amount of data that is typically required to be scanned on and off chip. Furthermore, the scan testing clock is often significantly slower than the actual system clock.

What is needed is a method and an apparatus for testing an integrated circuit without the problems associated with large probe points and without the performance problems associated with using scan-path structures.

SUMMARY

One embodiment of the present invention provides a system for capacitively probing electrical signals within an integrated circuit. This system operates by placing a probe conductor in close proximity to, but not touching, a target conductor within the integrated circuit. In this position, the probe conductor and the target conductor form a capacitor that stores a charge between the probe conductor and the target conductor. Next, the system detects a change in a probe voltage on the probe conductor caused by a change in a target voltage on the target conductor, and then determines a logic value for the target conductor based on the change in the probe voltage.

In one embodiment of the present invention, determining the logic value for the target conductor involves, determining a first value if the probe voltage decreases, and determining a second value if the probe voltage increases.

In one embodiment of the present invention, the target conductor is located in a highest metal layer of the integrated circuit.

In one embodiment of the present invention, placing the probe conductor in close proximity to the target conductor involves aligning the probe conductor with the target conductor using an electrical, mechanical or optical alignment mechanism.

In one embodiment of the present invention, the present invention causes a liquid dielectric to be placed between the probe conductor and a target conductor.

In one embodiment of the present invention, the system additionally allows the logic value to be gathered by testing circuitry coupled to the probe conductor.

In one embodiment of the present invention, the probe conductor is located on a second integrated circuit. In this embodiment, the target conductor is used to drive a value onto the second integrated circuit through the probe conductor.

In one embodiment of the present invention, the target conductor includes a plurality of target conductors disposed on a surface of the integrated circuit. Furthermore, the probe conductor includes a plurality of probe conductors disposed on a surface of a second integrated circuit. This allows the plurality of probe conductors to simultaneously monitor the plurality of target conductors when the plurality of probe conductors are aligned with the plurality of target conductors. In a variation on this embodiment, the plurality of probe conductors are organized into a two-dimensional grid on the second integrated circuit. In a variation on this embodiment, during design of the integrated circuit, a plurality of target signals from within the integrated circuit are routed to the plurality of target conductors. This allows the plurality of target signals to be monitored by the plurality of probe conductors. In a variation on this embodiment, the target conductor includes a bonding pad of the integrated circuit.

DETAILED DESCRIPTION

The following description is presented to enable any person skilled in the art to make and use the invention, and is provided in the context of a particular application and its requirements. Various modifications to the disclosed embodiments will be readily apparent to those skilled in the art, and the general principles defined herein may be applied to other embodiments and applications without departing from the spirit and scope of the present invention. Thus, the present invention is not intended to be limited to the embodiments shown, but is to be accorded the widest scope consistent with the principles and features disclosed herein.

The data structures and code described in this detailed description are typically stored on a computer readable storage medium, which may be any device or medium that can store code and/or data for use by a computer system. This includes, but is not limited to, magnetic and optical storage devices such as disk drives, magnetic tape, CDs (compact discs) and DVDs (digital versatile discs or digital video discs), and computer instruction signals embodied in a transmission medium (with or without a carrier wave upon which the signals are modulated). For example, the transmission medium may include a communications network, such as the Internet.

Testing System

Figure 1A:
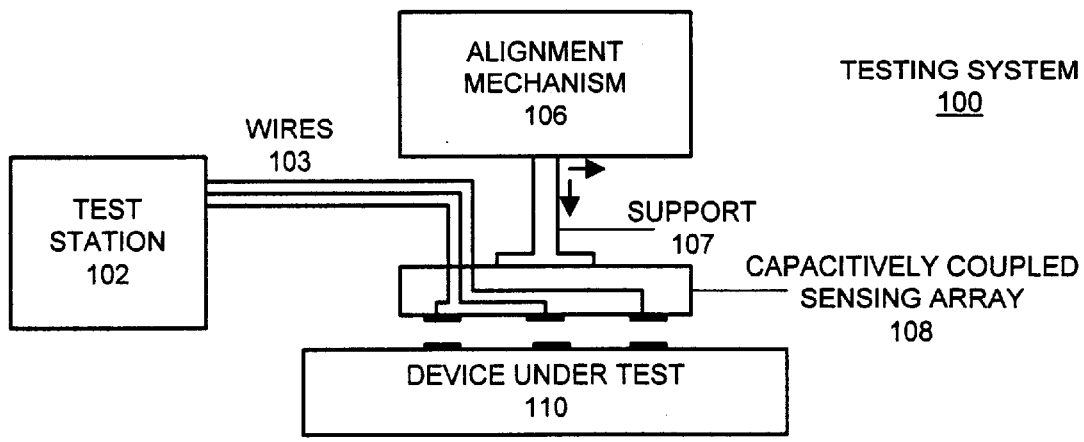
FIG. 1A illustrates a testing system for an integrated circuit in accordance with an embodiment of the present invention.

FIG. 1A illustrates a testing system 100 for an integrated circuit in accordance with an embodiment of the present invention. Testing system 100 includes a test station 102, that gathers information from a device under test 110 by means of a capacitively coupled sensing array 108. Note that sensing array 108 is coupled to alignment mechanism 106 through support 107. Alignment mechanism 106 aligns sensing array 108 with device under test 110 so that a number of probe conductors on sensing array 108 are aligned with a number of target conductors on device under test 110. These probe conductors are electrically coupled to test station 102 through a number of vias within sensing array 108 that feed signals through to the back side of sensing array 108, and then through wires 103 to test station 102.

Note that device under test 110 can generally include any type of integrated circuit die or wafer. Sensing array 108 can generally include a semiconductor die with probe conductors and amplification circuitry as is described in more detail below with reference to FIGS. 2–5. Alignment mechanism can generally include any type of electrical, mechanical and/or optical alignment mechanism for precisely controlling the relative positions of device under test 110 and sensing array 108. Test station 102 can generally include any type of system for gathering and/or analyzing data from sensing array 108.

Figure 1B:
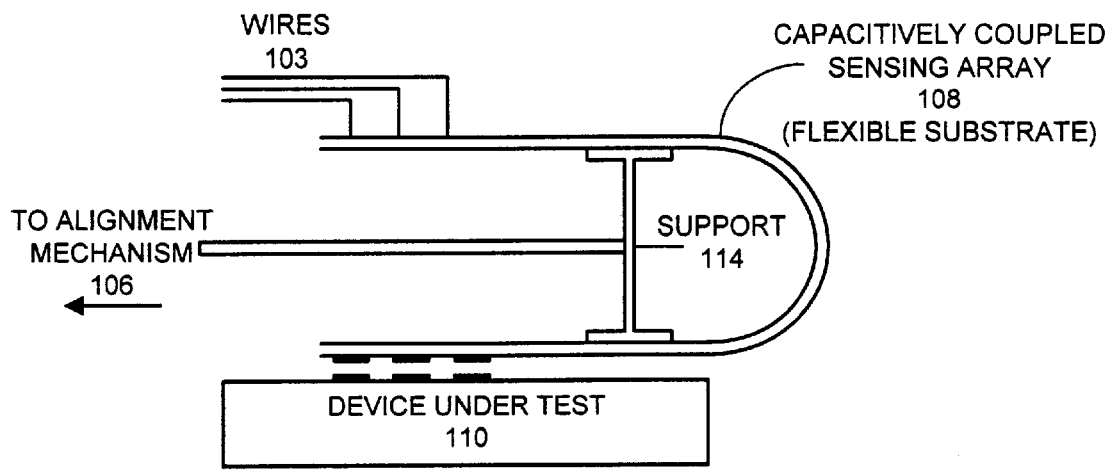
FIG. 1B illustrates a variation on the testing system illustrated in FIG. 1 in accordance with an embodiment of the present invention.

FIG. 1B illustrates a variation on the testing system 100 illustrated in FIG. 1 in accordance with an embodiment of the present invention. In this variation, sensing array 108 is located on a flexible substrate, which allows wires 103 to feed off of the same surface of sensing array 108 that the probe conductors are located on. This eliminates the need for vias to pass signals through to the back side of the sensing array 108 as is done in the embodiment illustrated in FIG. IA. Note that support 114 holds sensing array 108 in a biased (flexed) position.

Sensing Array

Figure 2:
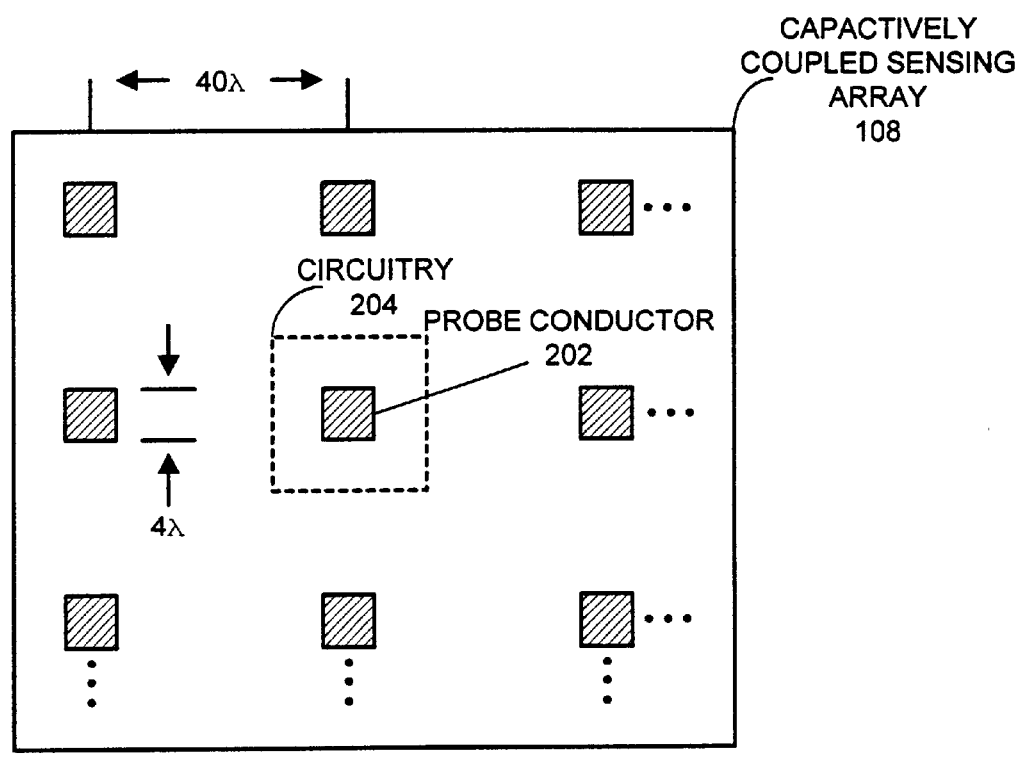
FIG. 2 illustrates a capacitively coupled sensing array with probe conductors in accordance with an embodiment of the present invention.

FIG. 2 illustrates a capacitively coupled sensing array 108 with probe conductors in accordance with an embodiment of the present invention. In this embodiment, a number of $4\lambda$ by 4 probe conductors, such as probe conductor 202, are fabricated in a metal layer on a surface of an integrated circuit on $40\lambda$ grid points. Note that this $40\lambda$ grid can be used to monitor target conductors located on $40\lambda$ grid points, or on any multiple of $40\lambda$ grid points. (Note that the value $\lambda$ is commonly used to specify feature size of a semiconductor process. $\lambda$ is typically ½ of the smallest feature size.)

In another embodiment, the probe conductors are located so as to be aligned with corresponding target conductors on device under test 110. In this embodiment, sensing array 108 is specially fabricated for device under test 110.

Note that each probe conductor 202 in sensing array 108 is located in close proximity to circuitry 204 which detects the state of a signal in a corresponding target conductor. Circuitry 204 is described in more detail below with reference to FIG. 5.

Device Under Test

Figure 3:
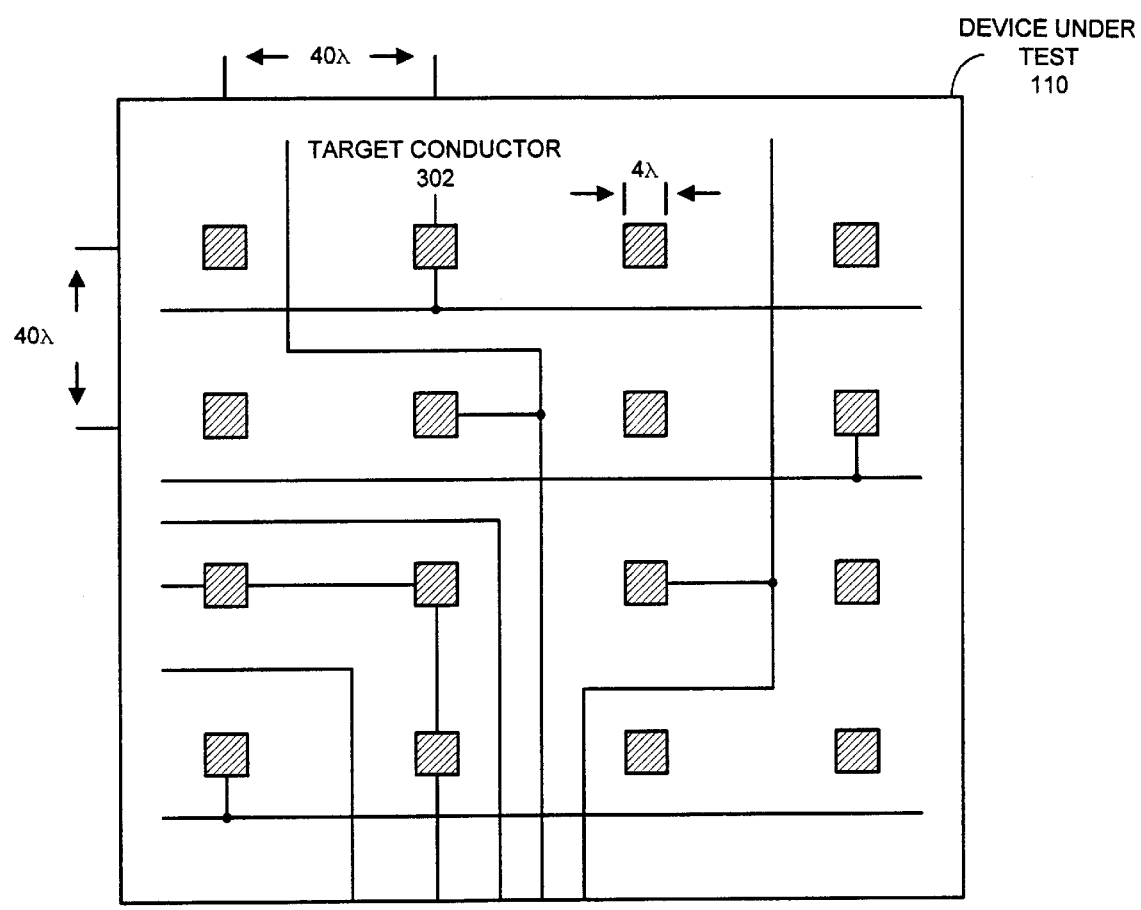
FIG. 3 illustrates a device under test with target conductors in accordance with an embodiment of the present invention.

FIG. 3 illustrates device under test 110 with target conductors in accordance with an embodiment of the present invention. Device under test 110 includes a number of target conductors, such as target conductor 302, located in a highest metal layer within device under test 110. In one embodiment of the present invention, these target conductors are $4\lambda$ by $4\lambda$ in size, and are located on 40, grid points.

Note that a number of target signals flow along conducting paths through different layers of device under test 110. During the design process, a target signal is routed through signal lines and/or vias to a nearest target conductor, such as target conductor 302. This allows the target signal to be monitored through target conductor 302. Also note that some target conductors on the grid may remain unused.

Moreover, note that the $4\lambda$ by $4\lambda$ target conductors are much smaller than conventional probe points, which are typically quite large (several hundred $\lambda$ by several hundred $\lambda$) in order to facilitate a mechanical contact. Hence, there can be many more target conductors than probe points on a given integrated circuit. Furthermore, the target conductors present a very small load on signal lines, whereas conventional probe points present a very large load, and hence typically require signal amplification.

Timing Diagram of System Operation

Figure 4:
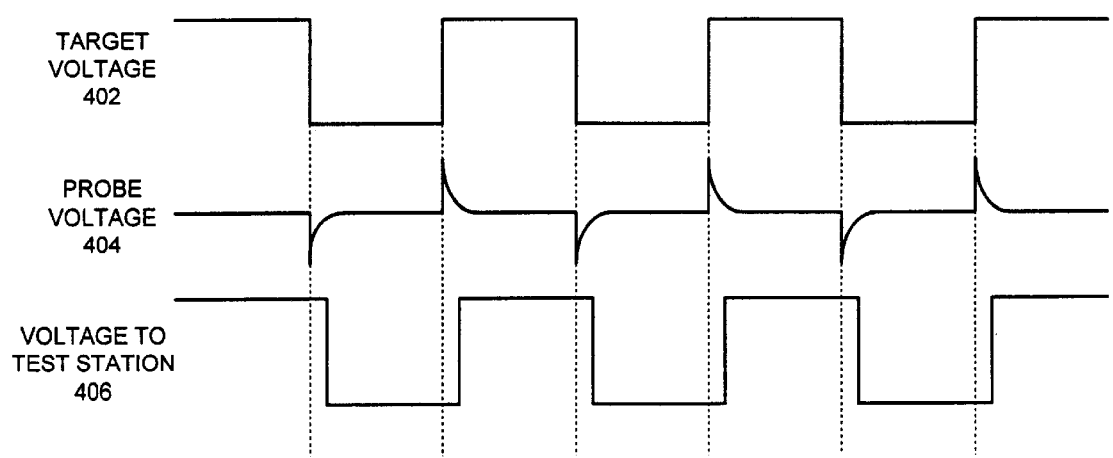
FIG. 4 is a timing diagram illustrating how the testing system illustrated in FIG. 1 operates in accordance with an embodiment of the present invention.

FIG. 4 is a timing diagram illustrating how testing system 100 illustrated in FIG. 1 operates in accordance with an embodiment of the present invention. As is illustrated in FIG. 4, a target voltage 402 from a target conductor 302 causes changes in a corresponding probe voltage 404 in a proximate probe conductor 202. Note that probe voltage 404 momentarily changes whenever target voltage 402 increases or decreases. Probe voltage then returns to a steady state as the capacitor formed between the probe conductor 202 and the target conductor 302 charges up or charges down to compensate for the change in target voltage 402. Finally, circuitry 204 associated with probe conductor 202 converts probe voltage 404 into a signal that is sent to test station 102. This circuitry is described in more detail below with reference to FIG. 5.

Circuitry

Figure 5:
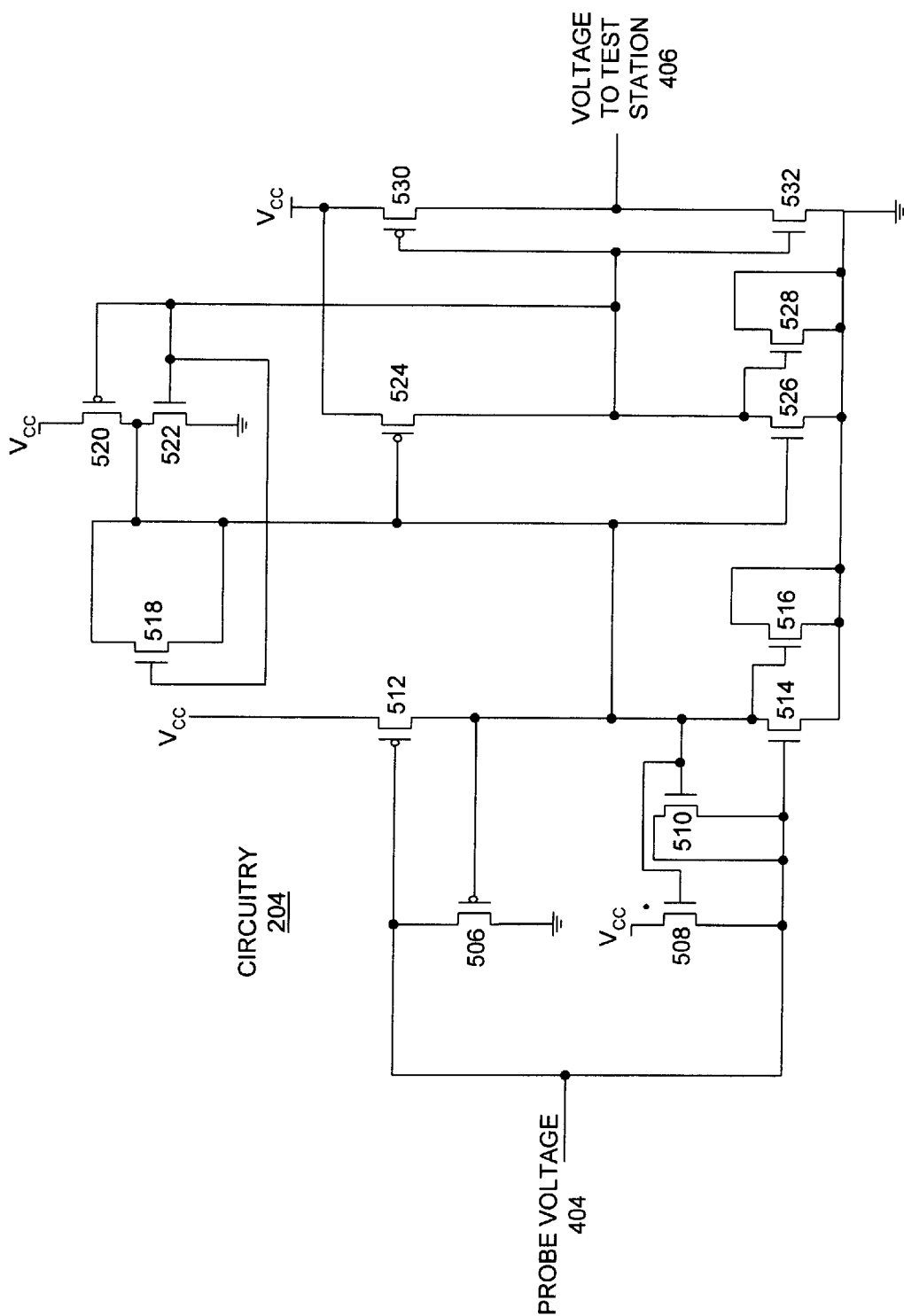
FIG. 5 is a circuit diagram illustrating circuitry associated with a probe conductor in accordance with an embodiment of the present invention.

FIG. 5 illustrates circuitry 204 associated with probe conductor 202 in accordance with an embodiment of the present invention. This circuitry takes probe voltage 404 as an input from probe conductor 202 and generates voltage to test station 406.

Note that a momentary increase in probe voltage 404 causes voltage to test station 406 to move to a high value. Conversely, a momentary decrease in probe voltage 404 causes voltage to test station 406 to move to a low value.

Furthermore, voltage to test station 406 remains at either a high value or a low value unless influenced by a subsequent change in probe voltage 404.

Testing Process

Figure 6:
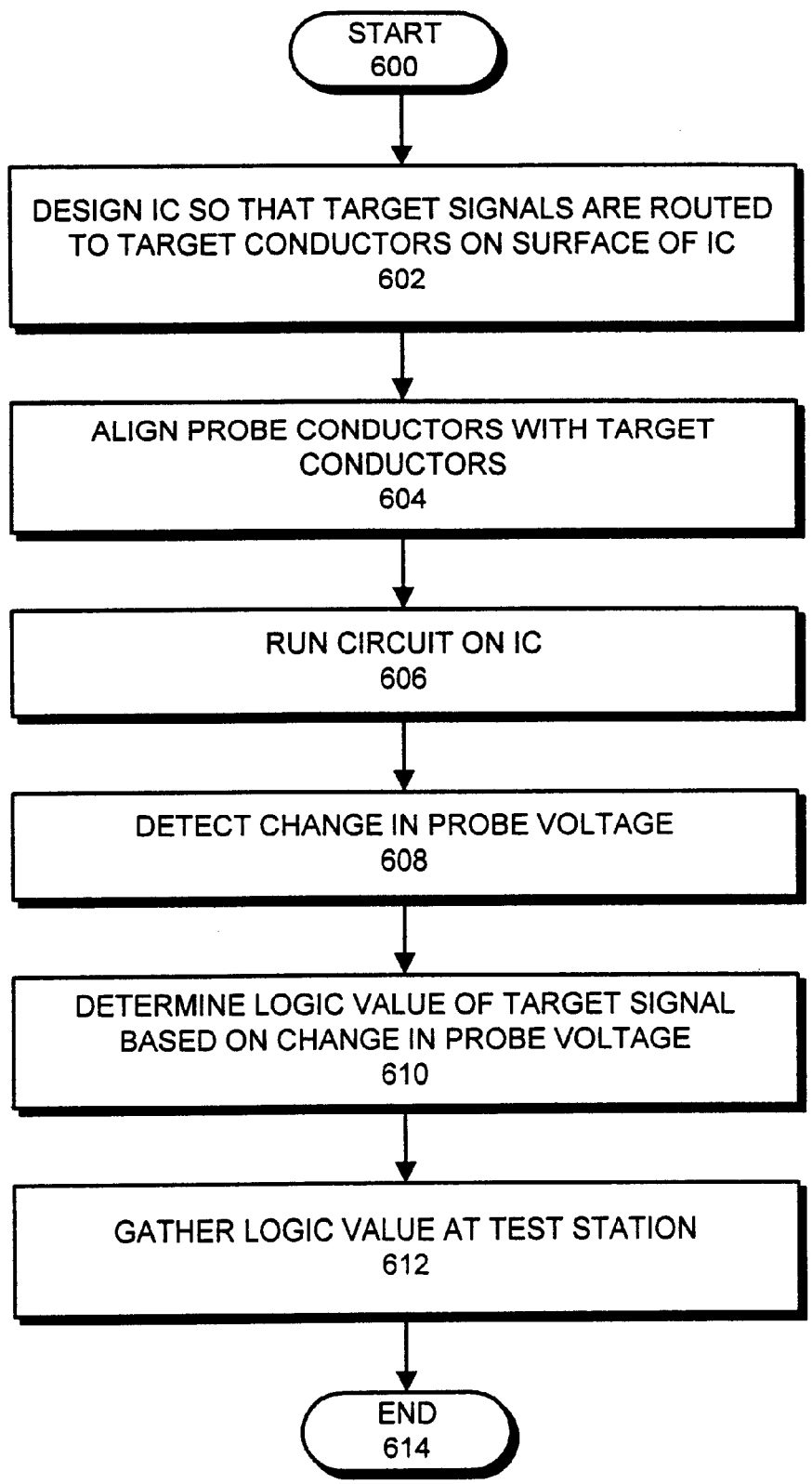
FIG. 6 is a flow chart illustrating the testing process in accordance with an embodiment of the present invention.

FIG. 6 is a flow chart illustrating the testing process in accordance with an embodiment of the present invention. The testing process starts when a device under test 110 is designed so that target signals are routed to target conductors on the surface of the device under test 110 (step 602). An example of such a routing appears in FIG. 3 above. Note that in one embodiment of the present invention, sensing array 108 may be specially fabricated with probe conductors that are aligned to match corresponding target conductors in FIG. 3.

Next, alignment mechanism 106 causes probe conductors on sensing array 108 to be aligned with target conductors on device under test 110 (step 604). Note that if sensing array 108 is smaller than device under test 110, sensing array 108 may have to be moved to different locations on device under test 110 to gather information from different target conductors on device under test 110. In the limiting case, there may only be a single probe conductor.

Also note that a probe conductor is aligned to be in close proximity to, but not touching, a corresponding target conductor. This causes a gap between the probe conductor and the target conductor, which may be filled with air, or alternatively a liquid dielectric, such as a paste of titanium dioxide, or any other liquid dielectric material. This gap may also contain an overglass layer of device under test 110.

Next, device under test 110 is operated during a system test (step 606). During this system test, circuitry 204 detects a change in probe voltage 404 (step 608). Based upon this change, circuitry 204 determines a logic value of the target signal (step 610), and outputs this logic value to test station 102, thereby allowing test station 102 to gather the logic value (step 612).

Note that in addition to testing logic levels of target signals, the present invention can additionally be used to test whether a large metal layer structure is properly formed. For example, an array of probe conductors can be moved over different portions of a bonding pad or a wide metal signal line in order to detect whether the bonding pad or signal is complete, or whether fabrication errors have caused gaps to be formed in the metal layer structure.

The foregoing descriptions of embodiments of the present invention have been presented for purposes of illustration and description only. They are not intended to be exhaustive or to limit the present invention to the forms disclosed. Accordingly, many modifications and variations will be apparent to practitioners skilled in the art. Additionally, the above disclosure is not intended to limit the present invention. The scope of the present invention is defined by the appended claims.

What is claimed is:

1. A method for capacitively probing electrical signals within an integrated circuit, comprising:

placing a probe conductor in close proximity to, but not touching, a target conductor within the integrated circuit, wherein a size of the probe conductor and the target conductor is commensurate with a smallest feature found on the integrated circuit;

wherein the probe conductor and the target conductor form a capacitor that stores a charge between the probe conductor and the target conductor;

detecting a change in a probe voltage on the probe conductor caused by a change in a target voltage on the target conductor;

determining a logic value for the target conductor from the change in the probe voltage; and allowing testing circuitry coupled to the probe conductor to gather the logic value, wherein the testing circuitry is integrated into the probe conductor;

whereby the size of the probe conductor and the target conductor allows testing of the integrated circuit independent of a mounting substrate.

2. The method of claim 1, wherein determining the logic value for the target conductor involves:

determining that the logic value for the target conductor is a first value if the probe voltage decreases; and determining that the logic value for the target conductor is a second value if the probe voltage increases.

3. The method of claim 1, wherein the target conductor is located in a highest metal layer of the integrated circuit.

4. The method of claim 1, wherein placing the probe conductor in close proximity to the target conductor involves aligning the probe conductor with the target conductor using at least one of:

an electrical alignment mechanism;

a mechanical alignment mechanism;

an optical alignment mechanism; and a mechanism that includes micro-machined silicon structures that are located on-chip.

5. The method of claim 1, wherein the probe conductor is located on a second integrated circuit; and wherein the target conductor is used to drive a value onto the second integrated circuit through the probe conductor.

6. The method of claim 1, wherein the target conductor includes a plurality of target conductors disposed on a surface of the integrated circuit; and wherein the probe conductor includes a plurality of probe conductors disposed on a surface of a second integrated circuit, so that plurality of probe conductors can simultaneously monitor the plurality of target conductors when the plurality of probe conductors are aligned with the plurality of target conductors.

7. The method of claim 6, wherein the plurality of probe conductors are organized into a two-dimensional grid on the second integrated circuit.

8. The method of claim 6, wherein the method further comprises routing a plurality of target signals from within the integrated circuit to the plurality of target conductors during design of the integrated circuit, so that the plurality of target signals can be monitored by the plurality of probe conductors.

9. The method of claim 1, wherein the target conductor includes a bonding pad of the integrated circuit.

10. The method of claim 1, further comprising causing a liquid dielectric to be placed between the probe conductor and a target conductor.

11. An apparatus that capacitively probes electrical signals within an integrated circuit, comprising:

a probe conductor;

an alignment mechanism, coupled to the probe conductor, that is configured to place the probe conductor in close proximity to, but not touching, a target conductor within the integrated circuit, so that the probe conductor and the target conductor form a capacitor that stores a charge between the probe conductor and the target conductor;

wherein a size of the probe conductor and the target conductor is commensurate with a smallest feature found on the integrated circuit;

a detection mechanism, coupled to the probe conductor, that is configured to detect a change in a probe voltage on the probe conductor caused by a change in a target voltage on the target conductor;

a logic value generation mechanism, coupled to the detection mechanism, that is configured to determine a logic value for the target conductor from the change in the probe voltage; and testing circuitry coupled to the probe conductor that is configured to gather the logic value, wherein the testing circuitry is integrated into the probe conductor;

whereby the size of the probe conductor and the target conductor allows testing of the integrated circuit independent of a mounting substrate.

12. The apparatus of claim 11, wherein the logic value generation mechanism is configured to:
   determine that the logic value for the target conductor is a first value if the probe voltage decreases; and
   determine that the logic value for the target conductor is a second value if the probe voltage increases.

13. The apparatus of claim 11, wherein the target conductor is located in a highest metal layer of the integrated circuit.

14. The apparatus of claim 11, wherein the alignment mechanism includes at least one of:
   an electrical alignment mechanism;
   a mechanical alignment mechanism;
   an optical alignment mechanism; and
   a mechanism that includes micro-machined silicon structures that are located on-chip.

15. The apparatus of claim 11,
   wherein the probe conductor is located on a second integrated circuit; and
   wherein the target conductor is configured to drive a value onto the second integrated circuit through the probe conductor.

16. The apparatus of claim 11,
   wherein the target conductor includes a plurality of target conductors disposed on a surface of the integrated circuit; and
   wherein the probe conductor includes a plurality of probe conductors disposed on a surface of a second integrated circuit, so that plurality of probe conductors can simultaneously monitor the plurality of target conductors when the plurality of probe conductors are aligned with the plurality of target conductors.

17. The apparatus of claim 16, wherein the plurality of probe conductors are organized into a two-dimensional grid on the second integrated circuit.

18. The apparatus of claim 16, wherein the integrated circuit includes a plurality of routing lines for routing a plurality of target signals from within the integrated circuit to the plurality of target conductors disposed on the surface of the integrated circuit, so that the plurality of target signals can be monitored by the plurality of probe conductors.

19. The apparatus of claim 11, wherein the target conductor includes a bonding pad of the integrated circuit.

20. The apparatus of claim 11, further comprising a mechanism that is configured to cause a liquid dielectric to be placed between the probe conductor and a target conductor.

21. An apparatus that capacitively probes electrical signals within an integrated circuit, comprising:
   a probe conductor;
   an alignment mechanism, coupled to the probe conductor, that is configured to place the probe conductor in close proximity to, but not touching, a target conductor within the integrated circuit, so that the probe conductor and the target conductor form a capacitor that stores a charge between the probe conductor and the target conductor;
   wherein a size of the probe conductor and the target conductor is commensurate with a smallest feature found on the integrated circuit a detection mechanism, coupled to the probe conductor, that is configured to detect a change in a probe voltage on the probe conductor caused by a change in a target voltage on the target conductor;
   a login value generation mechanism, coupled to the detection mechanism, that is configured to output a first value if the probe voltage decreases, and to output a second value if the probe voltage increases; and
   a testing circuit coupled to the probe conductor that is configured to gather an output of the logic value generation mechanism, wherein the testing circuit is integrated into the probe conductor;
   wherein the probe conductor includes a plurality of probe conductors disposed on a surface of a second integrated circuit, so that plurality of probe conductors can simultaneously monitor a plurality of target conductors disposed on a surface of the integrated circuit;
   whereby the size of the probe conductor and the target conductor allows testing of the integrated circuit independent of a mounting substrate.

* * * * *

UNITED STATES PATENT AND TRADEMARK OFFICE
CERTIFICATE OF CORRECTION

PATENT NO.     : 6,600,325 B2
DATED          : July 29, 2003
INVENTOR(S)    : William S. Coates et al.

It is certified that error appears in the above-identified patent and that said Letters Patent is hereby corrected as shown below:

<u>Column 8,</u>
Line 34, please delete the word, "login" and replace with the word -- logic --.

Signed and Sealed this

Twenty-third Day of September, 2003

JAMES E. ROGAN
*Director of the United States Patent and Trademark Office*